United States Patent
Romano et al.

(10) Patent No.: US 7,235,430 B2
(45) Date of Patent: Jun. 26, 2007

(54) SUBSTRATES HAVING INCREASED THERMAL CONDUCTIVITY FOR SEMICONDUCTOR STRUCTURES

(75) Inventors: Linda T. Romano, Sunnyvale, CA (US); Michael A. Kneissl, Mountain View, CA (US); John E. Northrup, Palo Alto, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/812,035

(22) Filed: Mar. 30, 2004

(65) Prior Publication Data

US 2004/0180470 A1 Sep. 16, 2004

Related U.S. Application Data

(62) Division of application No. 09/967,979, filed on Oct. 2, 2001, now Pat. No. 6,744,072.

(51) Int. Cl.
*H01L 21/44* (2006.01)
(52) U.S. Cl. .......................... 438/122; 438/22; 438/24; 438/46; 438/47; 438/540
(58) Field of Classification Search ................ 438/459, 438/997–998
See application file for complete search history.

(56) References Cited

U.S. PATENT DOCUMENTS

| | | | |
|---|---|---|---|
| 5,059,763 A * | 10/1991 | O'Brien et al. | 219/121.69 |
| 5,449,930 A * | 9/1995 | Zhou | 257/197 |
| 5,666,722 A * | 9/1997 | Tamm et al. | 29/847 |
| 5,731,046 A * | 3/1998 | Mistry et al. | 427/553 |
| 5,905,275 A | 5/1999 | Nunoue et al. | |
| 6,163,557 A * | 12/2000 | Dunnrowicz et al. | 372/46 |
| 6,189,771 B1 * | 2/2001 | Maeda et al. | 228/248.1 |
| 6,239,033 B1 * | 5/2001 | Kawai | 438/693 |
| 6,413,839 B1 * | 7/2002 | Brown et al. | 438/463 |
| 6,593,159 B1 * | 7/2003 | Hashimoto et al. | 438/22 |

OTHER PUBLICATIONS

CRC Handbook of chemistry and physics, 82nd Ed, by David Lide.*
F. A. Ponce et al., "Nitride-based semiconductors for blue and green light-emitting devices," *Nature*, vol. 386, pp. 351-358, Mar. 1997.

* cited by examiner

*Primary Examiner*—Wai-Sing Louie
(74) *Attorney, Agent, or Firm*—Oliff & Berridge, PLC

(57) ABSTRACT

Substrates having increased thermal conductivity are provided, comprising a body having opposed surfaces and a cavity that opens on at least one surface, the cavity containing at least one material having a greater thermal conductivity than the body. Devices are provided comprising a substrate and a semiconductor over a surface of the substrate. Methods of forming devices according to the invention are also provided.

20 Claims, 10 Drawing Sheets

SUBSTRATES HAVING INCREASED THERMAL CONDUCTIVITY FOR SEMICONDUCTOR STRUCTURES

This is a Divisional of Application Ser. No. 09/967,979 filed Oct. 2, 2001 now U.S. Pat. No. 6,744,072. The entire disclosure of the prior application is hereby incorporated by reference herein in its entirety.

BACKGROUND OF THE INVENTION

1. Field of Invention

This invention is directed to semiconductor devices that have reduced thermal resistance.

2. Description of Related Art

Some semiconductor devices experience poor performance because the heat that is generated during operation is not able to flow out of the semiconductor device efficiently. This leads to an increase in temperature that is detrimental to the performance of the semiconductor device. In many cases the temperature rise ($\Delta T$) is proportional to the heat per unit time ($\Delta W$) that is generated by the semiconductor device, i.e., $\Delta T=R\Delta W$. Here, the proportionality factor R is the thermal resistance of the semiconductor device.

The inefficient heat flow out of the semiconductor device is often attributable to those parts of the device that have low thermal conductivity. In some semiconductor devices, during operation, heat must flow from the point where the heat is generated to an external heat sink. The heat sink has a sufficiently large thermal mass so that its temperature remains equal to the ambient air. However, to reach the heat sink, the heat must often flow through a region of the device that has a low thermal conductivity. In this case, the thermal resistance R of the semiconductor device will be high. As a result, the temperature in the semiconductor device will be much higher than the temperature of the heat sink.

In light emitting diodes and lasers, heat is generated in the active region of the device and in the p- and n-contacts. This heat must usually flow through the substrate to reach the external heat sink. Light emitting diodes and lasers can be formed on substrates that have poor thermal conductivities. Sapphire, a commonly used substrate, has, for example, a thermal conductivity ($K_{th}$) of 0.42 W/cmK at room temperature.

The light output intensity of a light emitting device depends on the temperature at which the light emitting device operates. With a constant current flowing through such a light emitting device, the light output intensity is reduced as the temperature increases. In some cases, high temperatures will prevent lasing in laser diodes and the like. In semiconductor devices that have two or more light emitting devices adjacent to each other, the light ouput intensity of the first light emitting device is affected by the output power of the adjacent light emitting devices. This occurs because the temperature in the first device is affected by the amount of dissipated power, and therefore the amount of heat, that is generated by the adjacent devices. This effect is known as thermal cross-talk. For many applications, e.g., laser printing, cross-talk between adjacent light emitting devices is highly undesirable, because the light emitting devices are desirably separately addressable and completely independent from each other.

SUMMARY OF THE INVENTION

Calculations of the temperature distribution in semiconductor devices have shown that thinning a sapphire substrate and mounting the sapphire substrate on a heat sink can significantly reduce the heating of the devices. Currently, this thinning procedure is undertaken by backside polishing the sapphire substrate to a thickness of about 100 µm. Continuous wave devices have been achieved by this method, although the thermal resistance of these devices is more than 40 K/W.

Further thinning of the substrates would be desirable to further reduce heating. However, when using conventional techniques like polishing, a further reduction in substrate thickness is difficult to achieve without cracking the substrate. As a result, such thinning procedures have not been satisfactory to reduce heating.

As indicated above, commonly used substrates for group III-V nitride growth have poor thermal conductivities. In contrast, copper has a thermal conductivity of about 4 W/cm–K at room temperature. Copper, however, is not suitable as a substrate for growth of semiconductors, because its melting temperature is lower than the high temperatures required for growth of these materials.

Thus, there is a need for substrates with increased thermal conductivity, and which have the structural integrity of thick substrates.

This invention provides substrates with increased thermal conductivity and methods for forming these substrates.

This invention separately provides substrates having increased thermal conductivity with increased structural integrity.

This invention separately provides semiconductor devices usable as light emitting devices and methods for forming these semiconductor devices.

This invention separately provides semiconductor devices, such as semiconductor laser devices, having decreased sensitivity to self-heating effects.

This invention further provides semiconductor devices grown on substrates where some of the substrate material is replaced with a material having a higher thermal conductivity.

The inventors have discovered that, if there is a region formed of a material having enhanced thermal conductivity connecting the light emitting devices to the external heat sink, then the heat will flow out of the device along the path created by that material. As a result, the temperature of the device will depend less on the dissipated power of the adjacent devices. Thus, having materials with enhanced thermal conductivity between the active region of a device and the external heat sink will lead to lower temperatures during operation and to improved stability of operation. In many instances, such as with multiple monolithically integrated laser diodes, the thermal cross-talk between devices will also be reduced.

The substrates of this invention have a body comprising a material, such as sapphire, that is suitably usable for forming a semiconductor. The substrate body has a top surface and a bottom surface opposite to the top surface. The substrate body has a cavity defined by an inner surface of the substrate body. In various exemplary embodiments, the cavity opens onto at least the bottom surface. In various exemplary embodiments, the cavity contains a material having a greater thermal conductivity than the substrate body. This material is distributed in the cavity so that it is able transport heat from the top surface of the cavity to an external heat sink placed in the cavity and/or at or below the bottom surface of the substrate. Exemplary embodiments of the semiconductor devices of this invention comprise the substrate described above and at least one semiconductor structure formed over the top surface of the substrate. The semiconductor devices of this invention comprise a structure, such as that described above, and at least one p-contact that contacts the semiconductor structure, where the material in the cavity acts as the n-contact.

In various exemplary embodiments, the method for forming a substrate having increased thermal conductivity includes forming a cavity in a body of a substrate, where the cavity opens on at least a bottom surface of the body, and placing a material having a greater thermal conductivity than the substrate in the cavity. In various exemplary embodiments, the methods according to this invention further include forming at least one semiconductor structure over the top surface of the body.

These and other features and advantages of this invention are described in, or are apparent from, the following detailed description of various exemplary embodiments of the systems and methods according to this invention.

BRIEF DESCRIPTION OF THE DRAWINGS

Various exemplary embodiments of this invention will be described in detail, with reference to the following figures, wherein.

DETAILED DESCRIPTION OF EXEMPLARY EMBODIMENTS

This invention is directed to substrates for semiconductor structures that have improved thermal conductivity. The substrates include bodies having cavities containing a material having a greater thermal conductivity than the substrate body. This invention is further directed to devices having superior thermal conductivity properties. In addition, this invention is directed to methods for forming the structures outlined above.

Figure 1:
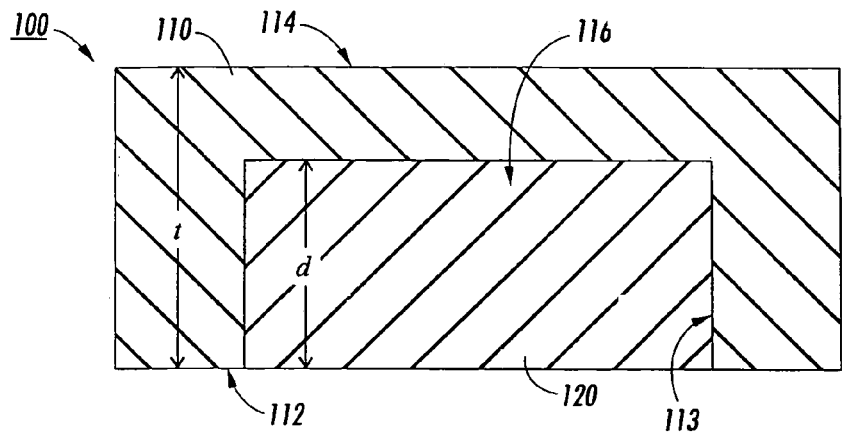
FIG. 1 is a cross-sectional view of a first exemplary embodiment of a substrate according to the invention including a cavity that opens only onto one surface of the substrate.

FIG. 1 illustrates a first exemplary embodiment of a substrate 100 according to this invention. The substrate 100 comprises a body 110 having a bottom surface 112 and a top surface 114. A cavity 116 defined by an inner surface 113 of the body opens onto the bottom surface 112. The cavity 116 contains a material 120 having a thermal conductivity that is greater than the thermal conductivity of the material used to form the body 110. In various exemplary embodiments, the material 120 contacts substantially all of the inner surface 113. However, in various exemplary embodiments, the cavity 116 can be partially or completely filled with the material 120. The material 120 is distributed so that heat can flow through the material 120 from the top surface of the cavity to an external heat sink that is located in the cavity and/or at or below the bottom surface 112.

The body 110 of the substrate 100 can be formed of any material that can be suitably used as a semiconductor substrate. For example, the substance used to form the body can be suitable for forming semiconductor light emitting devices. In particular, the substrate 100 can be formed of silicon carbide or spinel. In various exemplary embodiments, the body 110 of the substrate 100 is formed of sapphire. Sapphire is the most commonly used substrate material for forming semiconductor light emitting materials, such as group III-V nitrides, as discussed below. Group III-V nitrides can also be formed on silicon carbide or spinel, which have known advantages and disadvantages relative to sapphire. Silicon carbide is easy to etch and has closer lattice matching with group III-V nitrides than sapphire. Silicon carbide, however, is more expensive than sapphire. Spinel has closer lattice matching with group III-V nitrides than sapphire, but is a poorer thermal conductor. Spinel is also more difficult to find, and more expensive than sapphire. In light of a balancing of the various factors described above, sapphire is often used.

Suitable semiconductor substrate materials, especially the materials used to form substrates on which light emitting materials can be formed, are often inefficient in conducting heat between the semiconductor materials and the heat sink disposed on the opposite side of the substrate. In various exemplary embodiments, this invention reduces the detrimental effects of heat retention by creating a cavity in a body on which the semiconductor materials can be formed. A material having a greater thermal conductivity than the thermal conductivity of the body is then placed in the cavity. By incorporating or including a material having good thermal conductivity characteristics into the substrate, the thermal conductivity of the substrate 100 is improved. Consequently, the efficiency and function of semiconductor devices, such as light emitting devices, laser devices and the like, are improved.

The material 120 can be a metal having good thermal conductivity characteristics. For example, the material 120 can be gold or silver. In various exemplary embodiments, copper is used as the material 120, due to its high thermal conductivity coupled with relative low cost when compared with other metals also having good thermal conductivity properties.

The metals described above have much higher thermal conductivities than materials usable to form the body 110. The thermal conductivities for gold, silver and copper are shown in Table 1 below. Values for GaN, a semiconductor light emitting material, and sapphire are also shown for comparison.

TABLE 1

| Material | Thermal Conductivity $K_{th}$ (W/cm-K) |
| --- | --- |
| Sapphire | 0.4 |
| GaN | 1.3 |
| Copper | 4.0 |
| Silver | 4.3 |
| Gold | 3.2 |

In a first exemplary embodiment of the substrate 100 shown in FIG. 1, the body 110 has a thickness t and the cavity 116 has a depth d that is less than the thickness t, such that the cavity 116 opens onto only one surface, such as, for example, the bottom surface 112.

Figure 2:
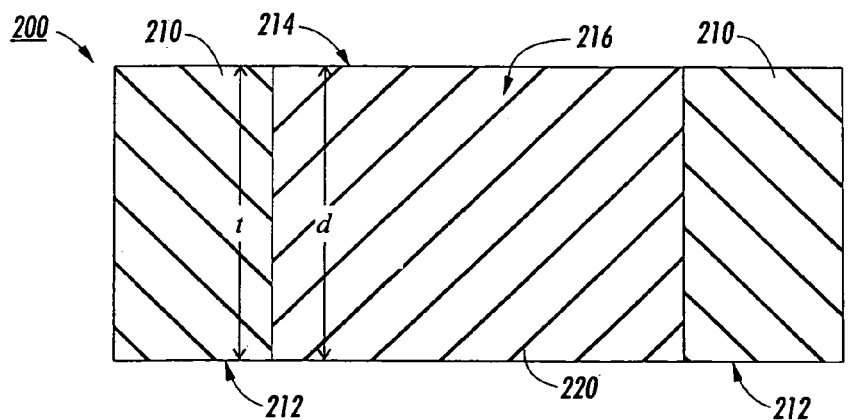
FIG. 2 is a cross-sectional view of a second exemplary embodiment of a substrate according to the invention including a cavity that opens onto two surfaces of the substrate.

In various other exemplary embodiments, such as the second exemplary embodiment illustrated in FIG. 2, a substrate 200 comprises a substrate body 210 having a thickness t. The cavity 216 has a depth d that is equal to the thickness t of the substrate body 210, such that the cavity 216 opens onto both the bottom surface 212 and the top surface 214 of the substrate body 210. Contact between a semiconductor material formed over the top surface 214 of the substrate body 210 and the material 220 permits the use of backside electrical contacts, i.e., contacts, formed on the bottom surface 212.

Figure 3:
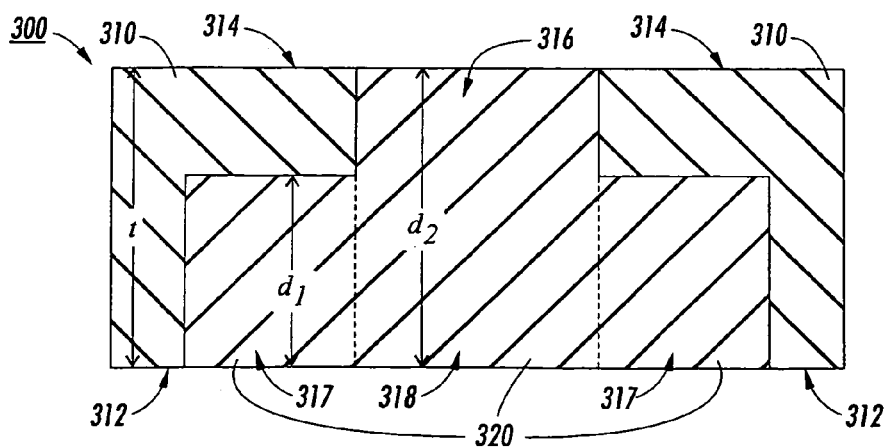
FIG. 3 is a cross-sectional view of a third exemplary embodiment of a substrate according to the invention including a cavity that opens onto two surfaces of the substrate, where the cavity has a stepped structure.

In various other exemplary embodiments, such as the third exemplary embodiment illustrated in FIG. 3, a substrate 300 comprises a cavity 316 having a stepped configuration. The cavity 316 includes a first portion 317 having a first depth $d_1$ that is less than the thickness t of the substrate body 310. A second portion 318 of the cavity 316 has a second depth $d_2$ that is equal to the thickness t of the substrate body 310, such that the cavity 316 opens onto both the bottom surface 312 and the top surface 314. The stepped configuration can optionally have more than the single stepped portion shown in the third exemplary embodiment 300 illustrated in FIG. 3.

With a stepped cavity configuration, such as in the third exemplary embodiment, thermal conductivity is increased by direct contact between a semiconductor material formed over the top surface 314 and the cavity material 320 used to fill the cavity 316. Contact between a semiconductor material and the cavity material 320 permits the use of backside electrical contacts, i.e., contacts formed on the bottom surface 312. The stepped configuration leads to increased structural integrity.

Figure 4:
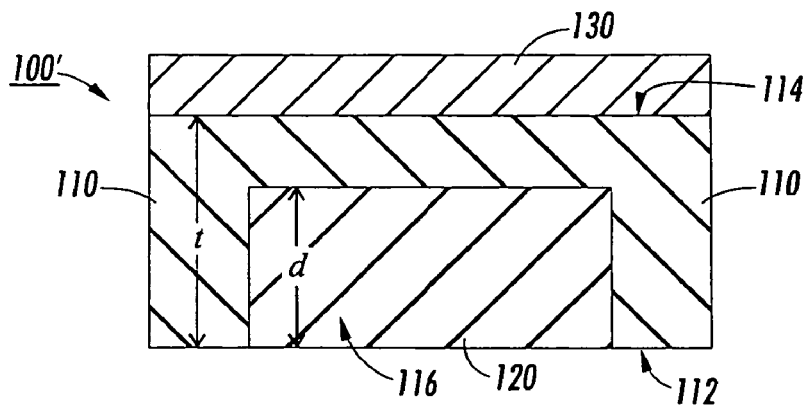
FIG. 4 is a cross-sectional view of a first exemplary embodiment of a semiconductor device according to the invention in which a material does not contact a semiconductor formed on a substrate.

FIG. 4 illustrates a first exemplary embodiment of the semiconductor device 100' according to this invention. Various exemplary embodiments of the semiconductor device 100' include the substrate 100 according to this invention as illustrated in FIG. 1 and described above. As shown in FIG. 4, a semiconductor structure 130 is formed over the top surface 114 of the substrate 100'.

In various exemplary embodiments, the semiconductor structure 130 can include a light emitting material, such as, for example, at least one group III-V nitride material. The III-V nitrides can be binary compounds, as well as ternary and quaternary alloys. These materials are favorably used in short-wavelength light-emitting devices. The Al—Ga—In—N system has a large band gap covering the entire visible spectrum and extending into the ultraviolet spectral range. The group III-V nitrides also have a strong chemical bond, which makes them very stable and resistant to degradation under conditions of high electric currents and intense light illumination found in the active regions of lasers. Exemplary embodiments of the semiconductor structures of this invention can comprise any of the group III-V nitrides. In particular, the semiconductor structure 130 can include GaN.

Figure 5:
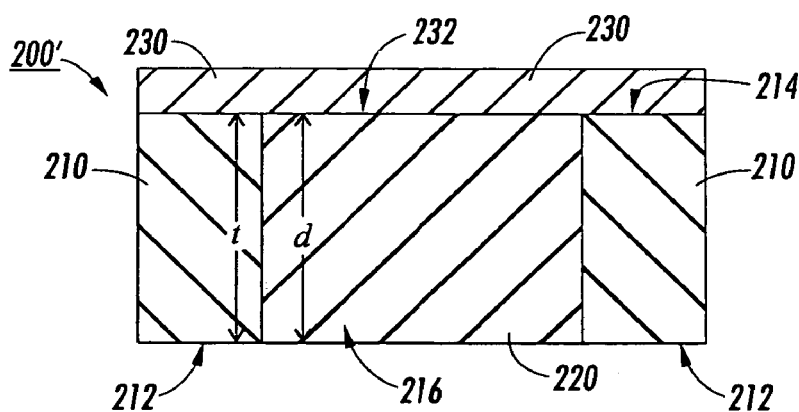
FIG. 5 is a cross-sectional view of a second exemplary embodiment of a semiconductor device according to the invention in which a material contacts a semiconductor formed on a substrate.

In various other exemplary embodiments, such as the second embodiment illustrated in FIG. 5, a semiconductor device 200' includes the substrate 200 according to this invention, as illustrated in FIG. 2 and described above. A semiconductor structure 230 is formed over the top surface 214 of the substrate 200. The cavity 216 opens onto the top surface 214 and the bottom surface 212. The material 220 contacts a bottom surface 232 of the semiconductor structure 230.

Figure 6:
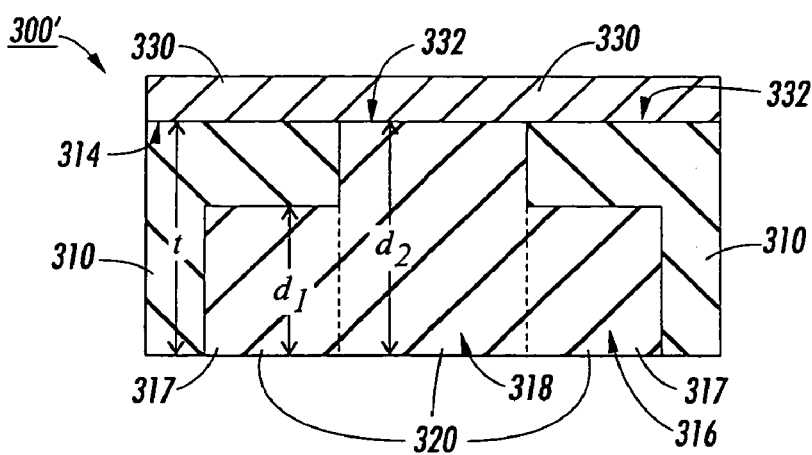
FIG. 6 is a cross-sectional view of a third exemplary embodiment of a semiconductor device according to the invention in which a material contacts a semiconductor formed on a substrate, where a cavity of the substrate has a stepped structure.

In various other exemplary embodiments, such as the third embodiment illustrated in FIG. 6, a semiconductor device 300' includes the substrate 300 according to this invention having the cavity 316 with a stepped configuration, as illustrated in FIG. 3 and described above. A semiconductor structure 330 is formed over the top surface 314. The cavity 316 opens onto the top surface 314 and the bottom surface 312. The material 320 contacts a bottom surface 332 of the semiconductor structure 330.

Figure 7:
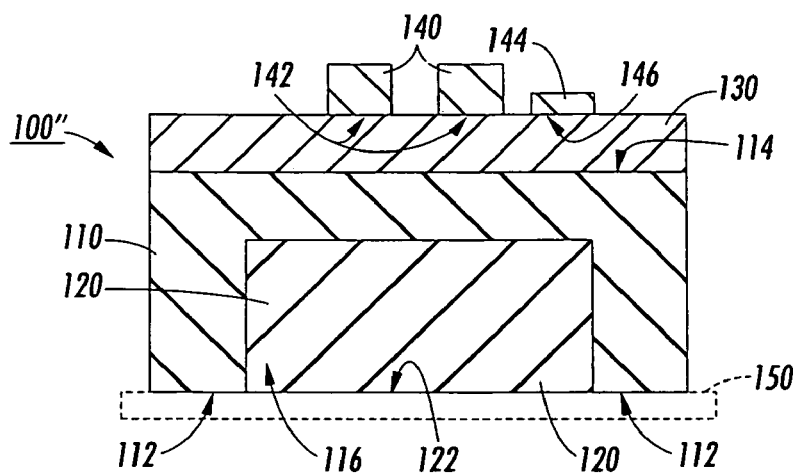
FIG. 7 is a cross-sectional view of a fourth exemplary embodiment of a semiconductor device according to the invention in which a material does not contact a semiconductor formed on a substrate, and at least one p-contact and at least one n-contact are in contact with the semiconductor formed on the substrate.

Various exemplary embodiments of the semiconductor devices according to this invention further include at least one p-contact and at least one n-contact. In a fourth exemplary embodiment of the semiconductor device 100", as illustrated in FIG. 7, the semiconductor device includes at least one p-contact 140 and at least one n-contact 144. The p-contacts 140 are in contact with the semiconductor structure 130. The n-contact 144 is also in contact with the semiconductor structure 130. A heat sink 150 can be placed in contact with the bottom surface 112 of the substrate 100 of the semiconductor device 100". In this case, the bottom surface 122 of the thermally conductive material 120 contacts the heat sink 150.

Figure 8:
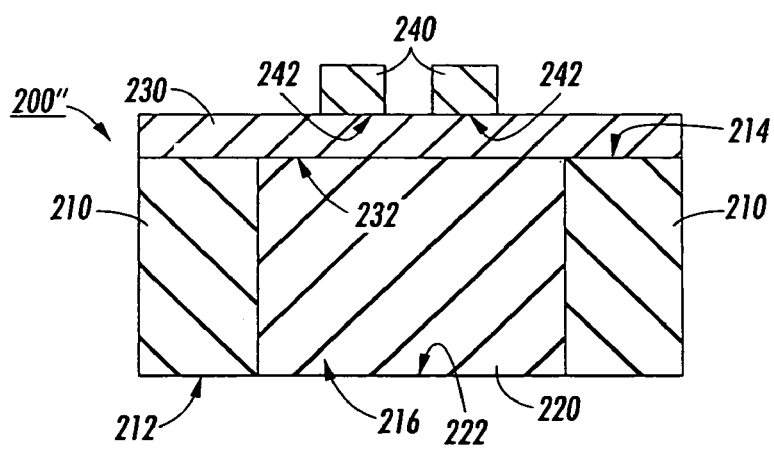
FIG. 8 is a cross-sectional view of a fifth exemplary embodiment of a semiconductor device according to the invention in which a material contacts a semiconductor formed on a substrate, at least one p-contact is in contact with the semiconductor formed on the substrate, and the material-serves as the n-contact.

FIG. 8 illustrates a fifth exemplary embodiment of the semiconductor device 200". As shown in FIG. 8, the semiconductor device 200 comprises at least one p-contact 240 which is in contact with the semiconductor 230. In this exemplary embodiment of the semiconductor device 200", the thermally conductive material serves as an n-contact. In this case, the thermally conductive material 220 should also be electrically conductive. A top surface 224 of the thermally conductive material 220 is, in turn, in contact with the bottom surface 232 of the semiconductor structure 230.

Figure 9:
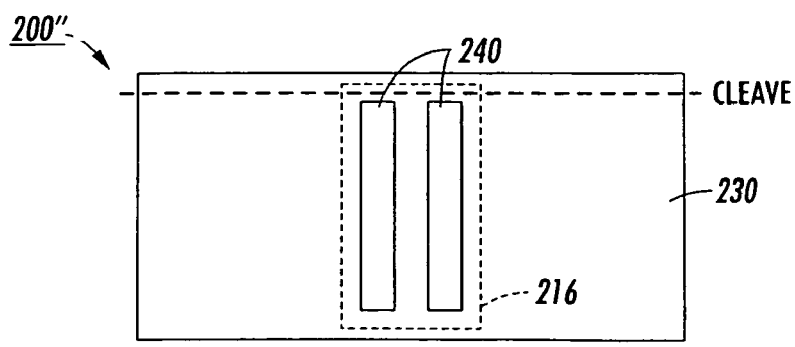
FIG. 9 is a top view of an exemplary embodiment of a semiconductor device according to the invention in which a length and a width of a cavity beneath a semiconductor formed on a substrate are illustrated-by dotted lines, and a plane formed by cleaving to form a laser facet is illustrated by a dashed line.

In various exemplary embodiments, the semiconductor devices 100', 100", 200', 200" and/or 300' can be light emitting devices, such as semiconductor laser devices. In the exemplary embodiment of the semiconductor device illustrated in FIG. 9, the cavity 216 has a first length and a first width and the one or more p-contacts 240 each have a second length and a second width. In various exemplary embodiments, the first length exceeds the second length. In various other, as well as some same exemplary embodiments, the first width exceeds the second width.

In exemplary embodiments of the semiconductor devices of the invention, the orientation of a material-filled cavity can be aligned with the p-contact(s). In various exemplary embodiments, group III-V nitride structures are formed by epitaxial layer overgrowth. Typical dimensions for the length and width of the substrate cavity for a dual spot laser device can be about 500 μm and about 50 μm, respectively. The long axis of the substrate cavity can be oriented parallel to the crystallographic <1-100> direction of the nitride material. Laser facets in the (1-100) plane of the nitride material are formed by cleaving. The quality of the cleave can be improved by having a substrate cavity that is slightly longer (by about 20-50 μm) than the p-contacts, which extend typically in the <1-100> direction.

This invention is further directed to methods for forming the devices described above. Various exemplary embodiments of the methods of this invention comprise forming a cavity in a body of a substrate having a bottom surface and a top surface. The cavity, defined by an inner surface of the body, opens on at least the bottom surface. A material having a greater thermal conductivity than the body of the substrate is placed into the cavity. In various exemplary embodiments the thermally conductive material used in the cavity contacts substantially all of the inner surface of the cavity. In various other exemplary embodiments, the thermally conductive material can fill only some of the cavity and/or can contact only some of the surface of the cavity and/or the semiconductor material, so long as the cavity is sufficiently filled and/or the surface of the cavity and/or the surface of the semiconductor material is sufficiently contacted that the heat flow from the semiconductor material into the thermally conductive material in the cavity is sufficient to reduce the detrimental effects of the heat generated by the semiconductor devices. The material can substantially fill the cavity. A semiconductor is formed on the top surface of the substrate opposite to the cavity.

In exemplary embodiments of the method according to this invention, the formed semiconductor can be a light emitting material, for example, any of the group III-V nitrides. GaN can be used. The semiconductor can be formed by any suitable method. In various exemplary embodiments, the semiconductor can be formed by epitaxial layer overgrowth.

In various exemplary embodiments of the method according to this invention, forming the semiconductor can comprise forming an InGaAlN laser structure. For example, an InGaAlN laser structure can be formed by depositing an InGaAlN epitaxial structure by metalorganic chemical vapor deposition (MOCVD). The InGaAlN laser structure can be formed by metalorganic chemical vapor deposition on a substrate, such as a sapphire substrate. In various exemplary embodiments, the sapphire substrate can be a 2-inch diameter sapphire substrate wafer. The sapphire substrate wafer can comprise c-face (0001) or a face (11-20) oriented sapphire. The sapphire substrate wafers can be of standard specifications, such as wafers including an epitaxial polish on one side and a 13-mil or 17-mil thickness, or other suitable specifications.

Figure 10:
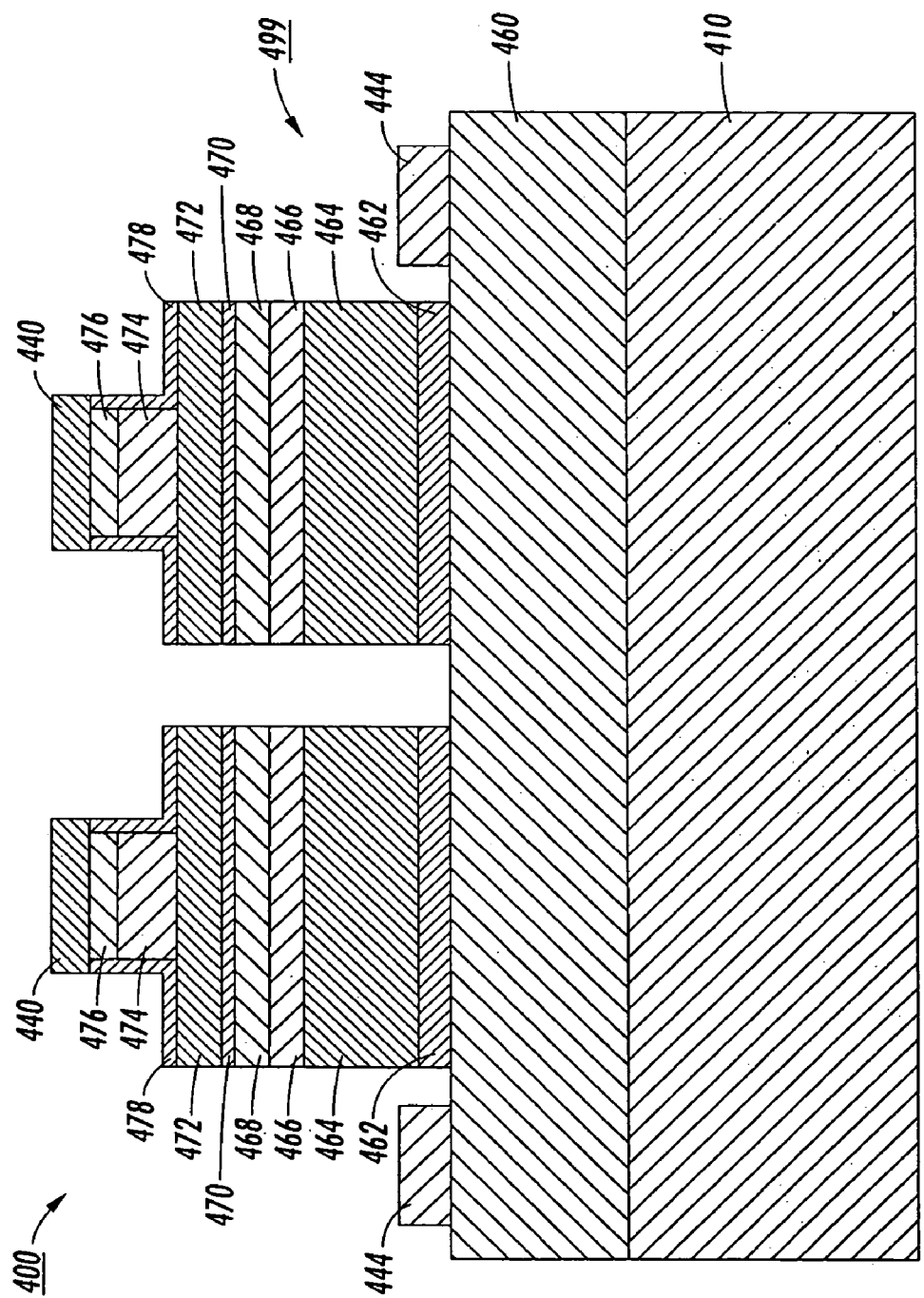
FIG. 10 is a cross-sectional view of a group III-nitride-based semiconductor laser device further including at least one p-contact and at least one n-contact that are in contact with the semiconductor formed on the substrate.

FIG. 10 illustrates a semiconductor device 400, including a substrate body 410 on which a semiconductor structure 499 has been formed by metalorganic chemical vapor deposition. While FIG. 10 depicts a semiconductor structure 499 on a solid structure, according to the invention, a cavity can be formed in the substrate body 410 either before or after formation of the semiconductor structure 499.

In the exemplary embodiment illustrated in FIG. 10, a semiconductor structure 499 has been formed on the sapphire substrate body 415. This exemplary semiconductor structure 499 includes a GaN:Si layer 460, an $In_{0.03}Ga_{0.97}N$:Si layer 462, an $Al_{0.08}Ga_{0.92}N$:Si layer 464, a GaN:Si layer 466, an InGaN multiple quantum well active region 468, an $Al_{0.2}Ga_{0.8}N$:Mg layer 470, a GaN:Mg layer 472, an $Al_{0.08}Ga_{0.92}N$:Mg layer 474, a GaN:Mg layer 476. In exemplary embodiments, the semiconductor device 400 also includes p-contacts 440, n-contacts 444 and a dielectric layer 478.

In various exemplary embodiments, such as the exemplary embodiment illustrated in FIG. 10, the various layers are formed sequentially on the sapphire substrate body 415. For example, the GaN:Si layer 460, having a thickness of from about 5 μm to about 20 μm, can be formed on the sapphire substrate 415. The $In_{0.03}Ga_{0.97}N$:Si layer 462 can be formed to a thickness of about 50 nm on the GaN:Si layer 460. Subsequently, the $Al_{0.08}Ga_{0.92}N$:Si layer 464 having a thickness of from about 0.5 μm to about 1.5 μm can be formed on the InGaN layer 462. The GaN:Si layer 466, having a thickness of about 0.1 μm, can be formed on the $Al_{0.08}Ga_{0.92}N$:Si layer 464. Next, an InGaN MQW active region 468 can be formed on the Ga:Si layer 466. The $Al_{0.2}Ga_{0.8}N$:Mg layer 470 can be formed to a thickness of about 20 nm on the InGaN MQW active region 468. The GaN:Mg layer 472 can then be formed to a thickness of about 0.1 μm on the AlGaN:Mg layer 470. The $Al_{0.08}Ga_{0.92}N$:Mg layer 474, having a thickness of from about 0.5 μm to about 1 μm, can be formed on the GaN:Mg layer 472. The exemplary semiconductor structure 499 illustrated in FIG. 10 can be completed by forming the GaN:Mg layer 476, to a thickness of about 0.1 μm, on the $Al_{0.08}Ga_{0.92}N$:Mg layer 474.

After forming the semiconductor structure 499, p-contacts 440, n-contacts 444 and a dielectric layer 478 can be added to complete the semiconductor device 400. The particular device described above and illustrated in FIGS. 10-15 is merely an example of a semiconductor device that advantageously uses the systems, structures and methods of this invention. The instant invention is readily applicable to any semiconductor device.

Exemplary embodiments of the methods of this invention comprise substantially filling the cavity with a material having a greater thermal conductivity than the body. In various exemplary embodiments, the cavity can be filled by electroplating. In particular, the cavity can be filled with a metal paste. However, it should be appreciated that any other known or later developed method for at least partially filling the cavity can be used in the methods according to this invention.

In exemplary embodiments of the method, the semiconductor layer(s) can be formed on the substrate before or after forming the cavity. When the semiconductor layer(s) is formed on the substrate after forming the cavity, the cavity is formed to have a depth that is less than the thickness of the body of the substrate, such that the material does not contact the semiconductor, as in the first exemplary embodiment of the device illustrated in FIG. 4. An advantage of forming the cavity prior to forming the semiconductor is that the cavity can be formed without protecting the semiconductor. However, at least some of the body of the substrate must remain as a surface for forming the semiconductor, so a cavity cannot be formed that opens onto the top surface of the body. Thus, forming the semiconductor material after forming the cavity limits the use of the thermally conductive material as an electrical contact. The filling of the cavity with the material can occur after formation of the semiconductor by a plating technique or with a metal paste.

In other exemplary embodiments of the method, the semiconductor material is formed on the substrate prior to forming the cavity. When the semiconductor material is formed on the substrate prior to forming the cavity, the cavity can be formed to a depth that is equal to the thickness of the body of the substrate, such that the cavity opens on both the bottom surface and the top surface, as in the second exemplary embodiment of the structure illustrated in FIG. 5. In this case the thermally conductive material contacts the semiconductor material. In such exemplary embodiments, all of the body of the substrate can be removed beneath the semiconductor. This enables using the thermally conductive material as an electrical contact to the semiconductor material.

When the semiconductor material is formed on the substrate prior to forming the cavity, the cavity can include a first portion having a first depth that is equal to the thickness of the body of the substrate and at least a second portion having a second depth that is less than the thickness of the body of the substrate, such that the cavity opens on the bottom surface and the top surface and the thermally conductive material contacts the semiconductor material, as in the third exemplary embodiment of the structure illustrated in FIG. 6. The stepped profile created by the various exemplary embodiments of the method has the added advantage of providing better structural support for the semiconductor and extending the thinned area of the body. In exemplary embodiments of the method, a narrow region of the body is cleared beneath the semiconductor and thinned in the neighboring regions.

In various exemplary embodiments of the method, the cavity can be formed using any suitable laser. In various exemplary embodiments, the substrate body can be mounted to a separate supporting substrate, such as silicon or copper, with wax, epoxy, or thermal conductive paste to promote better heat dissipation during cavity formation. Such heat dissipation could be desirable to prevent the temperature in the device from rising to levels that would lead to damage.

Figure 11:
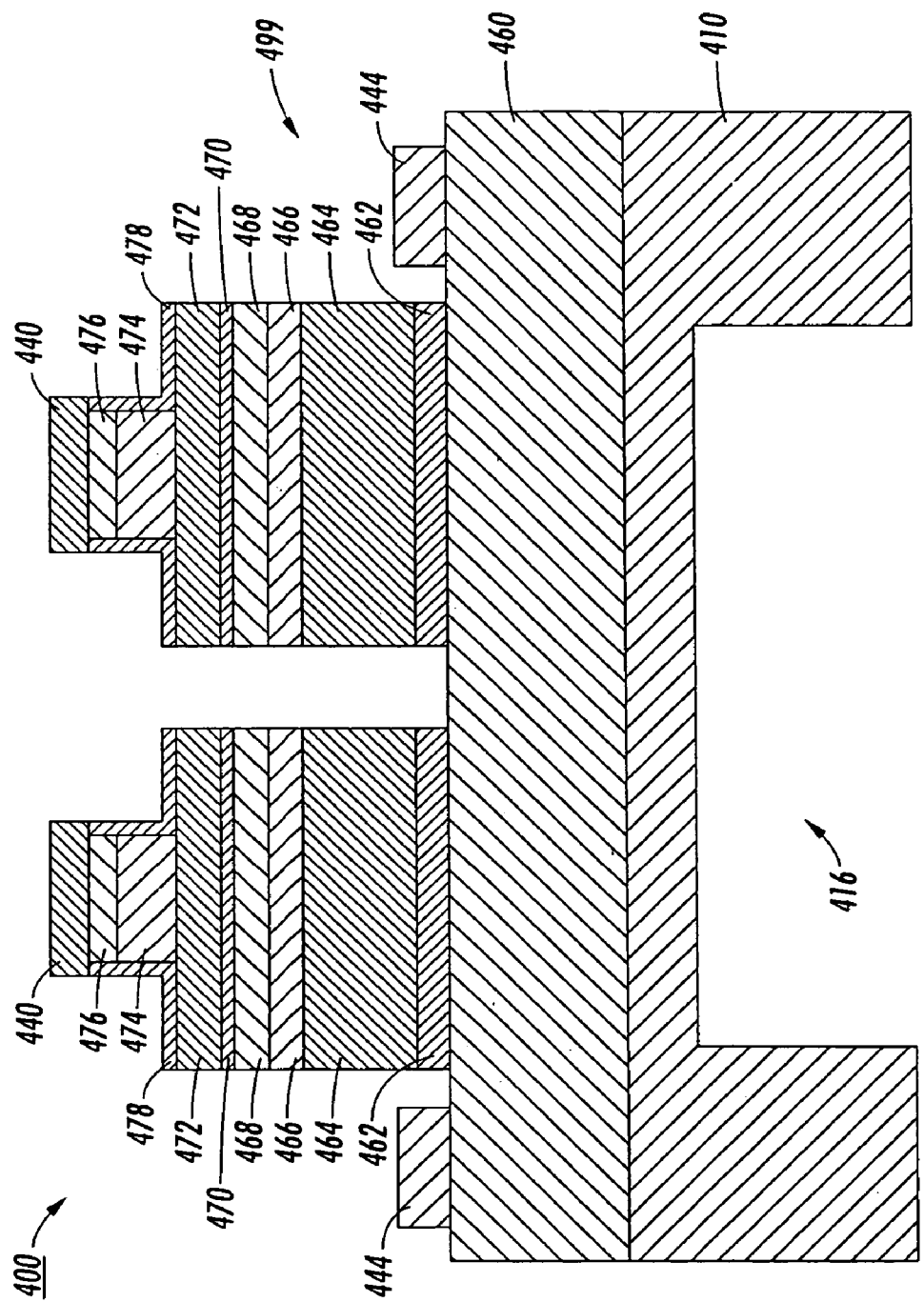
FIG. 11 is a cross-sectional view of a group III-nitride-based semiconductor laser device that includes a cavity that opens onto the bottom surface of the substrate.

FIG. 11 illustrates an exemplary embodiment of a semiconductor device 400 according to the invention, in which a cavity 416 has been formed by a laser ablation process. The semiconductor structure 499 can be formed either before or after forming the cavity 416. In various exemplary embodiments, the cavity 416 can be formed using a rare earth laser, such as a Nd:YAG laser. Nd:YAG lasers can be scanned to form a cavity in the body of the substrate in any desired height, width and length. In this way, most of the substrate body 410 can be left (i.e., not removed) to support layers formed over the substrate body 410, while a portion is thinned or completely removed, opening the cavity 416 on a top surface 414 which is in contact with the semiconductor structure 499.

In exemplary embodiments of the method, the laser can employ a spot size suitable to form the cavity 416. For example, the laser can have a spot size of at least about 20 µm. Particularly, the laser can have a spot size of between about 20 µm and about 100 µm. A suitable laser for forming cavities in sapphire is a Q-switched Nd:YAG laser ($\lambda$=1.06 µm) providing an energy density $10^6$ mJ/pulse/cm$^2$. The advantage of a Q-switched laser is the ability to switch on and off at peak power. At this power density, most of the energy is converted to vaporizing the sapphire. For typical scan rates and beam diameters, sapphire can be removed without significantly heating the surrounding material. At a frequency of 1 kHz and pulse width of 100 ns, the on/off ratio is approximately 1:10,000, which enables the dissipation of any residual heating. The depth resolution of the laser beam is better than 1.0 µm with the use of high magnification lenses. Use of a laser having these characteristics allows accurate control of how much sapphire is removed, regardless of whether the cavity 416 is formed before or after formation of the semiconductor structure 499.

Figure 12:
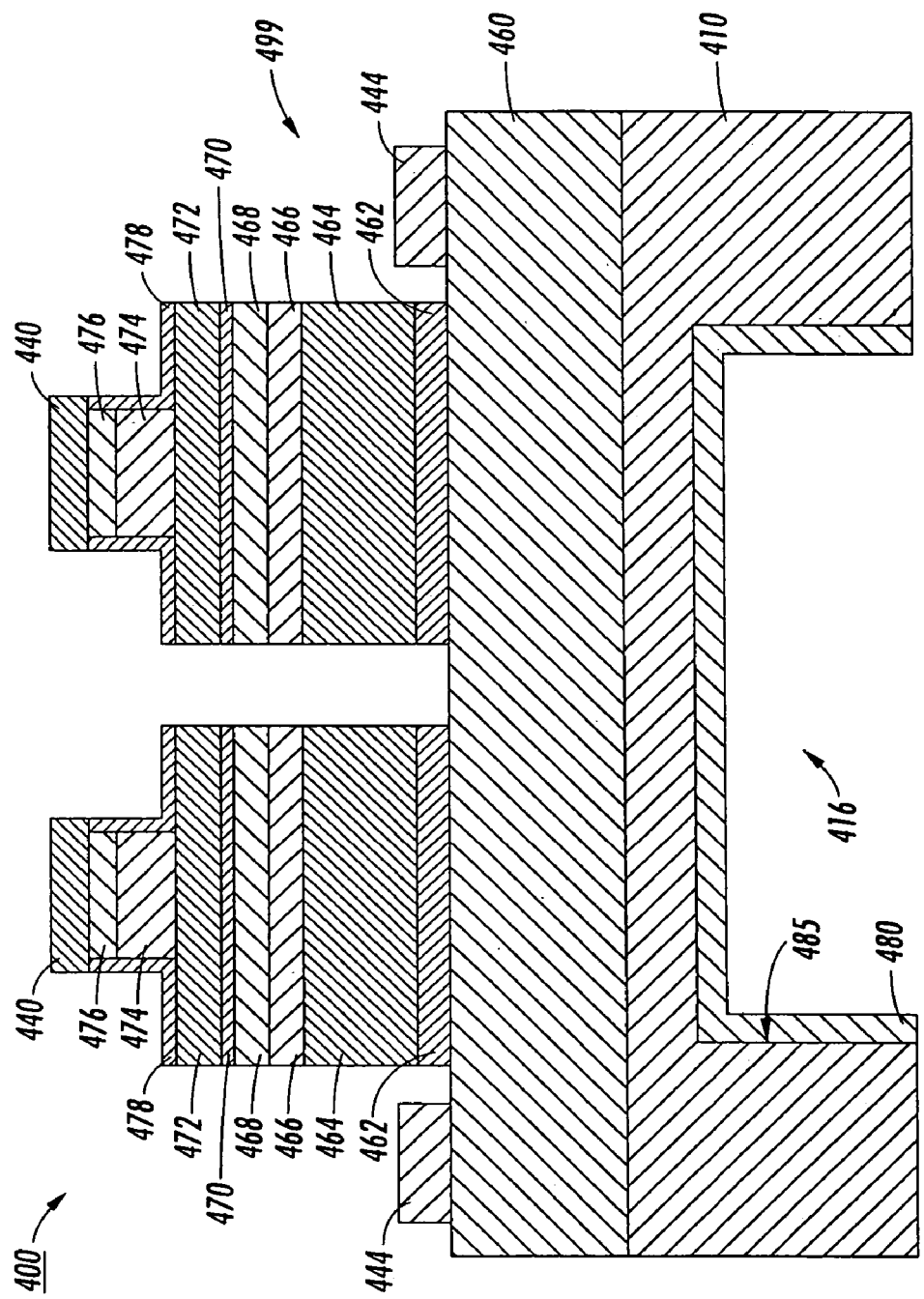
FIG. 12 is a cross-sectional view of an exemplary embodiment of a group III-nitride-based semiconductor laser device that includes a cavity that opens onto the bottom surface of the substrate and a metal seed layer covers the inside of the cavity.

FIG. 12 illustrates the device 400 according to the invention, in which a seed layer 480 has been formed on an inner surface 485 of the cavity 416. After the cavity 416 is formed, the cavity 416 can be backfilled with a metal paste, or can be backfilled by plating. In various exemplary embodiments, when the cavity 416 is filled by plating, a suitable seed layer 480 can be formed on the inner surface 485 of the cavity 416. For example, a thin Ti/Au layer (100 nm Ti, 200 nm Au) can be evaporated onto the inner surface 485 of the cavity 416 by thermal or e-beam evaporation. The Ti/Au seed layer 480 serves as a seed layer for the electro-plating or the electro-less plating process that follows in order to fill the cavity 416 with an additional thermally conductive material.

Figure 13:
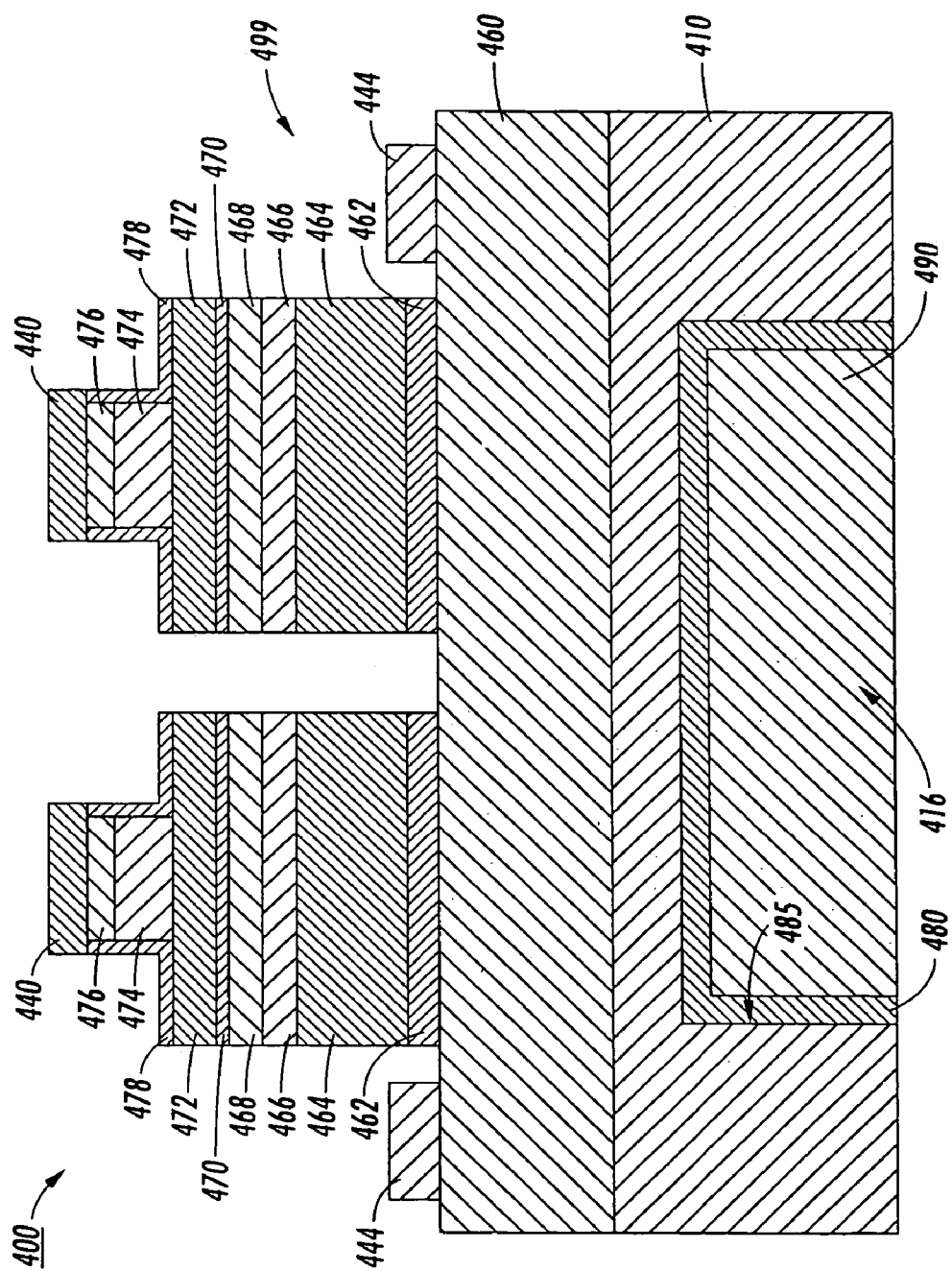
FIG. 13 is a cross-sectional view of an exemplary embodiment of a group III-nitride-based semiconductor laser device that includes a cavity that opens onto the bottom surface of the substrate and a metal seed layer covering the inside of the cavity, and in which the cavity has been filled with copper.

FIG. 13 illustrates the device 400 according to the invention in which the cavity 416 has been plated with a copper layer 490. In various exemplary embodiments, plating can be employed to completely fill the cavity 416 for maximum heat dissipation. Copper is ideally suited for that purpose, because copper is relatively inexpensive and has a very high thermal conductivity. The copper layer 490 can be electroplated with standard plating solutions, which are commercially available. For example, copper sulfate pentahydride can be used in an agitated $H_2O/H_2SO_4$ bath to electroplate copper onto the seed layer 480 to fill the cavity 416. Electro-plating can be performed at room temperature with typical cathode current densities of about 300 A/cm$^2$ to about 600 A/cm$^2$. The plating times depend on the cathode current density, but are typically on the order of about one hour for about 50 µm of plated copper.

Figure 14:
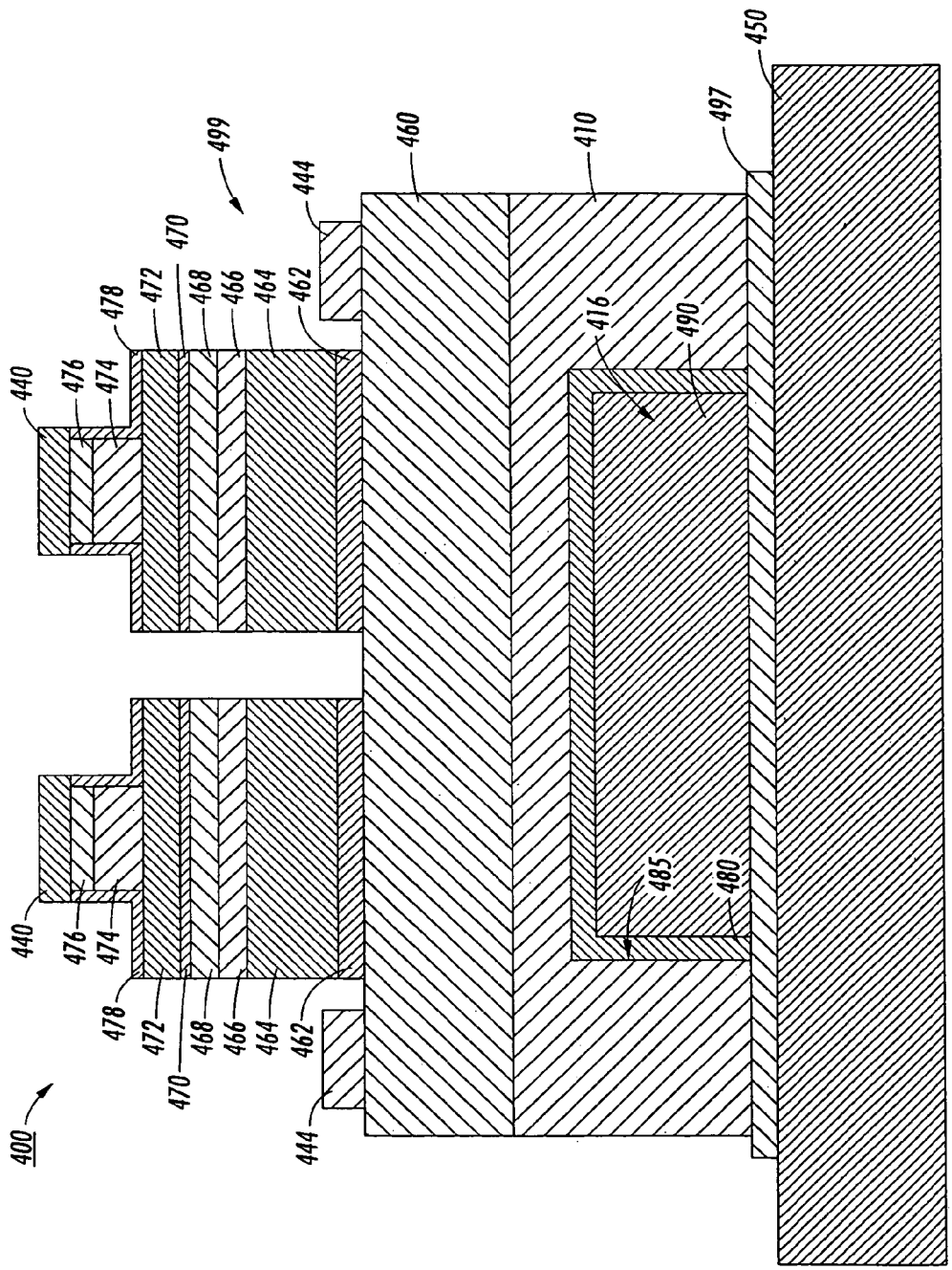
FIG. 14 is a cross-sectional view of an exemplary embodiment of a group III-nitride-based semiconductor laser device that is attached to a heat sink.

FIG. 14 illustrates a device 400 according to the invention, in which the cavity 416 filled with the copper layer 490 is mounted to a heat sink 450 by a layer of soldering material 497. In order to further improve the thermal properties of a semiconductor device according to the invention, the device 400 can be mounted onto the heat sink 450. Suitable materials for the heat sink 450 include copper, aluminum and diamond. The device 400 can be attached to the heat sink 450 by any suitable structure, device or material. For example, the device 400 can be adhered to the heat sink 450 with the layer of soldering materials 497. The soldering materials can include, but are not limited to, one or more of AuSn, PbSn or In. Before mounting the device 400 to the heat sink 450, the device 400 could be also diced or cleaved into separate devices.

Figure 15:
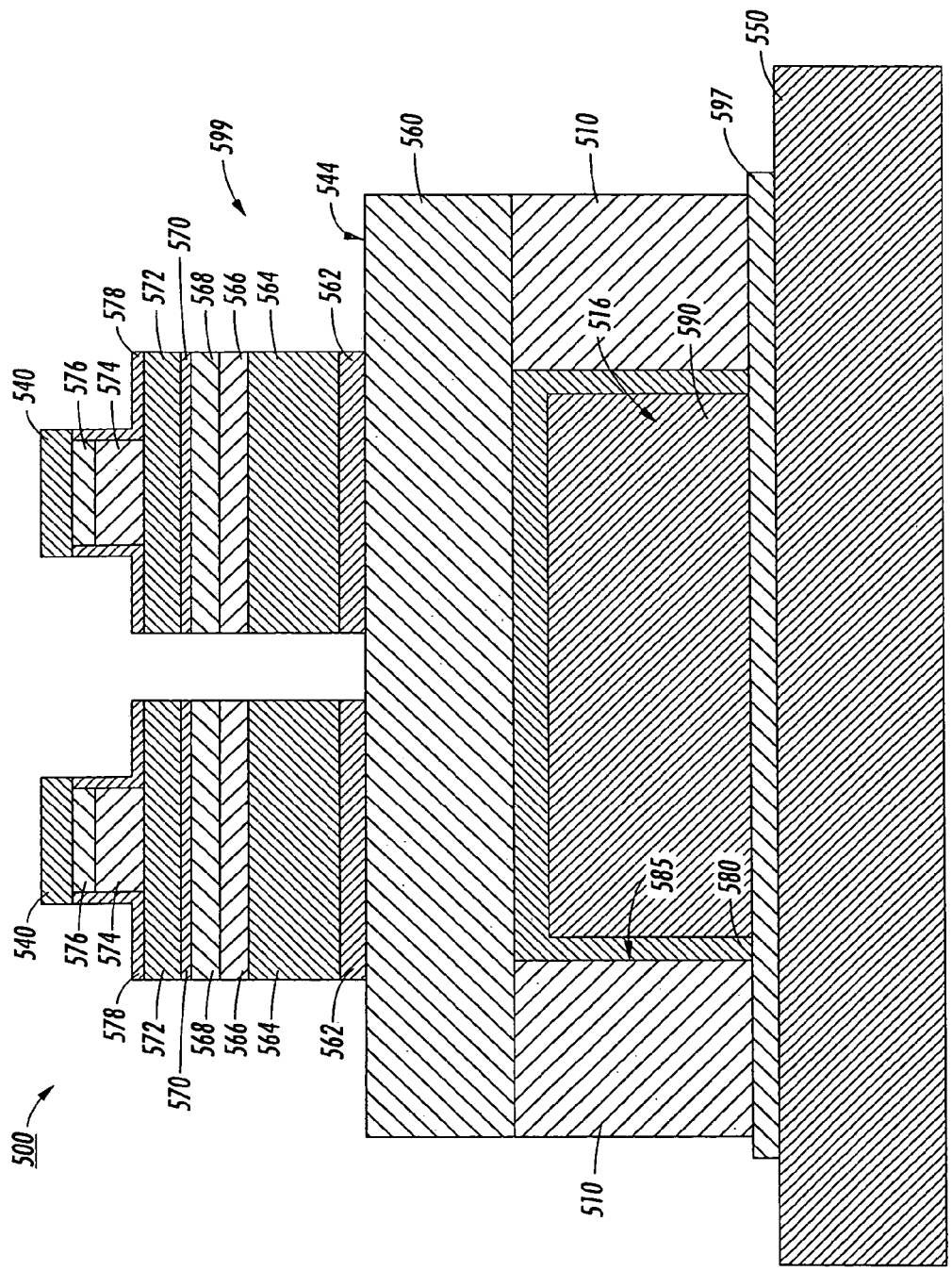
FIG. 15 is a cross-sectional view of an exemplary embodiment of a group III-nitride-based semiconductor-laser device that has a cavity that opens onto the top and bottom surfaces of the substrate and a metal seed layer covering the inside of the cavity.

FIG. 15 illustrates an exemplary embodiment of a device 500 according to the invention, in which a cavity 516 opens onto a top surface 514, and the seed layer 580 and a copper layer 590 serve as an n-contact for the device 500. If the cavity 516 has been formed to extend through the entire thickness of the substrate body 510, according to various embodiments of the invention, a backside n-contact can be formed through the copper-filled cavity 516. In that case, the seed layer 580 for the plating process can also serve as an n-contact to a semiconductor device 560. For example, this can be done by using Ti/Al/Ti/Au seed layers. In such embodiments, additional n-contacts on the device 500 are unnecessary because the n-contact to the device 500 is made through the copper-filled cavity 516.

Figure 16:
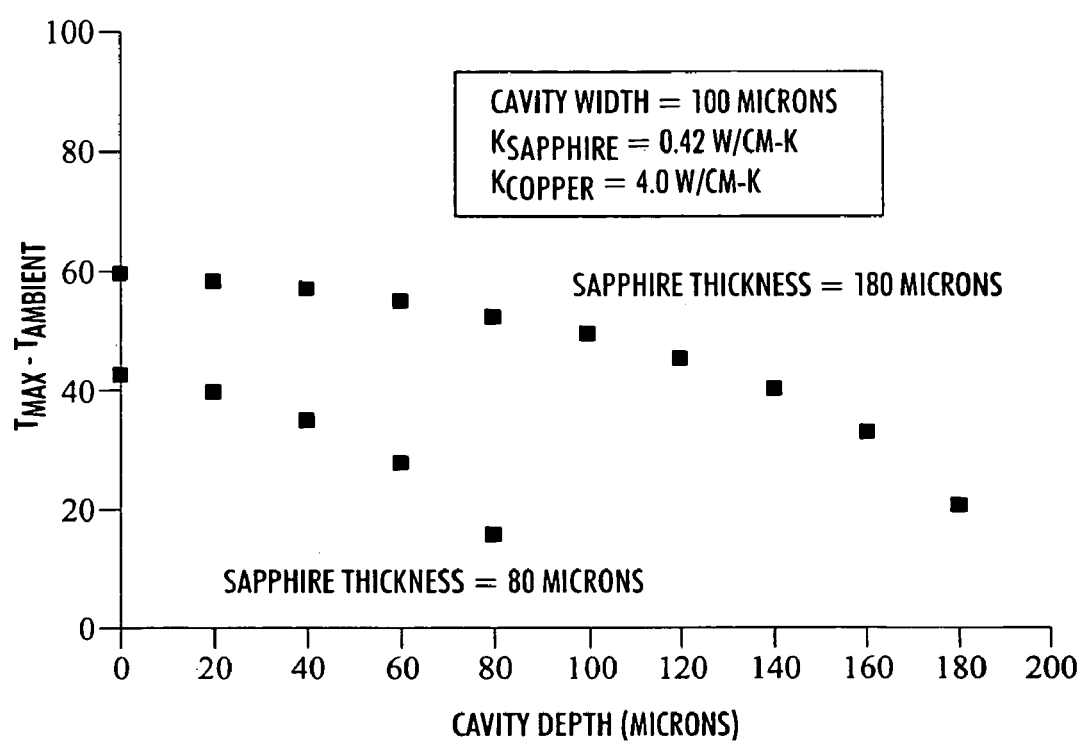
FIG. 16 is a graph showing values of the temperature rise in a semiconductor device according to this invention during operation of the device, where temperature rise is plotted as a function of the depth of the cavity.

FIG. 16 illustrates the values of temperature rise in the active region of a semiconductor device during operation plotted as a function of the depth of the cavity. The calculations were made assuming 0.75 W of dissipated power over a cavity length of 500 μm. The two sets of points correspond to two different values of the thickness of the body of the substrate. As shown, for a sapphire thickness of 80 microns, the temperature rise due to heat dissipation can be reduced from 40 K, corresponding to a thermal resistance value of 53 K/W, to less than about 20 K, corresponding to a thermal resistance value of 27 K/W, by employing a substrate with a sapphire body and a copper-filled cavity. The graph also illustrates that similar benefits are obtained in substrates having a thicker sapphire body.

While this invention has been described in conjunction with the specific embodiments above, it is evident that many alternatives, combinations, modifications, and variations are apparent to those skilled in the art. Accordingly, the preferred embodiments of this invention, as set forth above are intended to be illustrative, and not limiting. Various changes can be made without departing from the spirit and scope of this invention.

What is claimed is:

1. A method of forming a semiconductor device with increased thermal conductivity, comprising:
   forming a cavity having a length, width and thickness in a body of a sapphire substrate having relatively low thermal conductivity by ablating the body with a laser, the body having a thickness, a bottom surface and a top surface, the cavity opening onto at least the bottom surface;
   substantially filling the cavity with at least one material having a greater thermal conductivity than the body; and
   forming a semiconductor structure over the top surface and over the cavity,
   wherein at least one of the length and width of the cavity is substantially equal to or greater than the corresponding length and width of the semiconductor structure to provide a heat path for transporting heat away from the semiconductor structure that increases the thermal conductivity of the semiconductor device.

2. The method of claim 1, wherein forming the cavity comprises ablating the body with an Nd:YAG laser.

3. The method of claim 1, wherein forming the cavity comprises ablating the body with a laser having a spot size of at least about 20 μm.

4. The method of claim 1, wherein forming the semiconductor comprises forming a GaN semiconductor structure.

5. The method of claim 1 wherein at least partially filling the cavity comprises at least partially filling the cavity with at least one of a seed layer, Au, Ag or Cu.

6. The method of claim 1, wherein at least partially filling the cavity comprises:
   forming a seed layer on at least a portion of the inner surface of the cavity; and
   forming an additional at least one material layer in the cavity over the seed layers.

7. The method of claim 6, wherein forming an additional at least one material layer comprises plating the additional at least one material onto the seed layer.

8. The method of claim 1, wherein at least partially filling the cavity comprises at least partially filling the cavity with a metal paste.

9. The method of claim 1, wherein forming the semiconductor occurs after forming the cavity.

10. The method of claim 9, wherein:
    forming the cavity comprises forming the cavity to a depth that is less than the thickness of the body so that the cavity opens onto the bottom surface without opening onto the top surface.

11. The method of claim 1, wherein forming the cavity comprises forming at least a first portion having a first depth that is less than the thickness of the body and a second portion within the body having a second depth that is equal to the thickness of the body and greater than the first depth, the first portion having at least one of a width and a length that is greater than the second portion.

12. The method of claim 1, wherein forming the semiconductor occurs prior to forming the cavity.

13. The method of claim 12, wherein:
    forming the cavity comprises forming the cavity to a depth that is equal to the thickness of the body so that the cavity opens onto the bottom surface and the top surface;
    at least partially filling the cavity comprises at least partially filling the cavity so that the at least one material contacts the semiconductor.

14. The method of claim 12, wherein:
    forming the cavity comprises forming at least a first portion having a first depth that is less than the thickness of the body and a second portion within the body having a second depth that is equal to the thickness of the body, so that the cavity opens onto the bottom surface and the top surface, the second portion having at least one of a width and a length that is greater than the first portion; and
    at least partially filling the cavity comprises at least partially filling the cavity so that the at least one material contacts the semiconductor.

15. The method of claim 1, wherein the semiconductor structure includes at least one p-contact.

16. The method of claim 15, wherein the length of the cavity is aligned with the at least one p-contact.

17. The method of claim 1, wherein the cavity is filled to maximize thermal conductivity and structural rigidity of the semiconductor device.

18. The method of claim 1, wherein forming the cavity comprises ablating the body with a laser having a wavelength of about 1 μm.

19. A method of forming a semiconductor device with increased thermal conductivity, comprising:
  forming a cavity in a body of a sapphire substrate having relatively low thermal conductivity, the body having a thickness, a bottom surface and a top surface, the cavity opening onto the bottom surface, wherein forming the cavity comprises ablating the body with a laser;
  substantially filling the cavity with at least one material having a greater thermal conductivity than the body; and
  forming a heat generating semiconductor structure over the top surface,
  wherein the cavity is formed to a depth that is less than the thickness of the body so that the cavity opens onto the bottom surface without opening onto the top surface, the cavity forming a heat path that transports heat from the semiconductor structure away from the substrate.

20. The method of claim 1, wherein the body thickness is at least about 100 μm.

* * * * *